(12) United States Patent
Hilton

(10) Patent No.: US 6,699,732 B2
(45) Date of Patent: Mar. 2, 2004

(54) PITCH COMPENSATION IN FLIP-CHIP PACKAGING

(75) Inventor: Robert M. Hilton, Burpengary (AU)

(73) Assignees: Celerity Research Pte. Ltd., Singapore (SG); ASE Electronics (M) Sdn. Bhd., Penang (MY)

( * ) Notice: Subject to any disclaimer, the term of this patent is extended or adjusted under 35 U.S.C. 154(b) by 72 days.

(21) Appl. No.: 10/063,383

(22) Filed: Apr. 17, 2002

(65) Prior Publication Data

US 2002/0109238 A1 Aug. 15, 2002

(51) Int. Cl.[7] .................. H01L 21/44; H01L 21/48; H01L 21/50
(52) U.S. Cl. ............... 438/108; 438/129; 438/599; 438/612; 438/613; 438/666
(58) Field of Search ............... 438/975, FOR 435, 438/FOR 495, 108, 129, 599, 612, 613, 666

(56) References Cited

U.S. PATENT DOCUMENTS 6,118,182 A * 9/2000 Barrow ................ 257/773
6,310,403 B1 * 10/2001 Zhang et al. ........... 257/786

* cited by examiner

Primary Examiner—David E. Graybill
(74) Attorney, Agent, or Firm—David T. Millers

(57) ABSTRACT

A flip-chip package and packaging method use a substrate having bond pad spacing that matches terminal spacing on a chip at an elevated temperature, such as the temperature of the chip during bonding to the substrate, the melting point of solder used on the chip, a temperature within the range of thermal cycling of the chip, or an operating temperature of the chip. Matching spacing at an elevated temperature permits a better alignment at the bonding temperature for formation of stronger bonds.

9 Claims, 5 Drawing Sheets

PITCH COMPENSATION IN FLIP-CHIP PACKAGING

BACKGROUND OF INVENTION

Flip-chip packaging generally provides a small footprint package with a large number of electric connections to a semiconductor chip. FIG. 1A illustrates an example of a conventional flip-chip packaged device 100 including a semiconductor chip 110 that is attached to a substrate 130.

Semiconductor chip 110 can be any type of integrated circuit die containing active circuit elements that are electrically accessible through die pads on a surface of semiconductor chip 110. In FIG. 1A, an array of solder bumps 120 on the active surface of chip 110 electrically connect to the die pads and through the die pads to the active circuitry in chip 110, and chip 110 is flipped so that solder bumps 120 contact a top surface of substrate 130.

Substrate 130 is typically a printed circuit made of a composite material forming a flexible or rigid carrier having conductive traces. The traces are generally made of copper or another metal and include an array of bond pads 140. Solder bumps 120 on chip 110 electrically contact respective bond pads 140 on the top surface of substrate 130, and the conductive traces, which extend through substrate 130, electrically connect solder bumps 120 to solder balls 135 on the bottom surface of substrate 130. Solder balls 135 are typically arranged in a ball grid array and form the terminals of packaged device 100. The ball grid array can be attached to a printed circuit board or other circuitry in a product containing packaged device 100.

Generally, bond pads 140 on substrate 130, have a spacing that matches the spacing of solder bumps 120 of chip 110 at room temperature, so that at room temperature, the pitch of die pads on chip 110 matches the pitch of bond pads 140 on substrate 130. Accordingly, at room temperature, all of the solder bumps 120 can be centered on respective bond pads 140 as shown in FIG. 2A. However, at higher temperatures, a difference in the thermal expansion of semiconductor chip 110 and substrate 130 leads to a mismatch in the spacing of solder bumps 120 and pads 140. In particular, FIG. 2B shows a best-case alignment of solder bumps 120 and bond pads 140 when chip 110 and substrate 130 are at an elevated temperature. In FIG. 2B, solder bumps 120 near the center of the array are closest to being centered with respective bond pads 140, and solder bumps 120 near the edges of the array are significantly offset from the centers of respective bond pads 140. The differential alignment is related to the distance of the particular bond pad 140 from the central matching points (e.g., an origin 0,0) of chip 110 and substrate 130.

The process of attaching chip 110 to substrate 130 typically heats chip 110 and substrate 130 to a soldering temperature above the melting point of solder bumps 120. Solder bumps 120 at least partially melt and wet corresponding bond pads 140 when the temperature reaches the soldering temperature and then resolidify to bond to corresponding bond pads 140 when the temperature drops back below the melting point of the solder. Accordingly, the bonding occurs at a high temperature where the spacing of solder bumps 120 and bond pads 140 are mismatched as illustrated in FIG. 1C. Even with best-case alignment, electrical connections near the perimeter of the array of solder bumps 120 may be undependable because of the mismatch or smaller overlap of solder bumps 120 and bond pads 140. Additionally, alignment of chip 110 and substrate 130 for the bonding process must be precise since any variation from the best-case alignment illustrated in FIG. 2B will pull some of solder bumps 120 further from the centers of respective pads 140. The misalignment can particularly cause non-wetting or de-wetting where the melted solder fails to attach to at least some of bond pads 140. Additionally, the misalignment can causes "snowman" structures 125, where an extended solder structure connecting chip 110 to pads 140 is weak and subject to failure. When the package cools to room temperature, the faster shrinkage of the substrate deforms the bonds as illustrated in FIG. 3.

The amount of mismatch between the spacing of solder bumps 120 and the spacing of bond pads 140 and the associated problems arising from the mismatch typically depend on the materials used in substrate 130, the melting point of solder bumps 120, and the size of the array of solder bumps 120 on chip 110. As die size decreases and the number of terminals or solder bumps 120 required for die functionality increases, the spacing mismatch in flip-chip packages will worsen. Methods and structures for better matching of chip and substrate are thus needed.

SUMMARY OF INVENTION

In accordance with an aspect of the invention, a flip-chip packaging process forms a substrate having temperature compensated traces having a spacing that matches the spacing of solder bumps on a chip at an elevated temperature such as the melting point of the solder bumps. Accordingly, when a reflow or other high temperature process attaches the chip to the substrate, the solder bumps and traces can be better aligned and centered to provide a good contact for all solder bumps.

One specific embodiment of the invention is a device including a chip and a substrate. The chip has terminals (e.g., solder bumps) that are electrically connected to respective contact areas (e.g., bond pads) of conductive traces of the substrate. The spacing of the contact areas on the substrate differs from the spacing of the terminals on the chip when the chip and substrate are at room temperature, but the spacing of the contact areas on the substrate matches the spacing of the terminals on the chip when the chip and substrate are at an elevated temperature.

The elevated temperature can be approximately equal to the temperature at which the terminals are bound to respective contact areas. In particular, when the terminals use solder in bonds to the contact area, the elevated temperature can be the melting point of the solder or slightly higher. Alternatively, the elevated temperature can be selected to minimize stress in the bonds between the terminals and the contact areas. In particular, the elevated temperature can be at the center of a temperature cycle range for the chip or in an expected operating temperature range for the chip. Accordingly, the bonds are stress free at the center of the thermal cycle range or the operating temperature range. In either case, the matching of the terminals and contact areas at the elevated temperature improves the match or alignment at the bonding temperature in addition to reducing stress during operation of the package.

Another embodiment of the invention is a method for fabricating a flip-chip package. The method includes aligning a chip with a substrate, heating the chip and substrate to an elevated temperature where centers of terminals on the chip align with centers of corresponding contact areas of traces on the substrate, and bonding the terminals to the corresponding contact areas at a bonding temperature. In alternative embodiments, the elevated temperature is about equal to the bonding temperature (e.g., about equal to a melting temperature of solder used to bond the terminals and contact areas), or the elevated temperature is selected to reduce thermal stress on bonds between the terminals and the contact areas. The elevated temperature can be about equal to the middle of a temperature range expected during use of the flip-chip package or equal to an operating temperature of the flip-chip package.

BRIEF DESCRIPTION OF DRAWINGS

Use of the same reference symbols in different figures indicates similar or identical items.

DETAILED DESCRIPTION

A principal concern with room temperature matching of solder bumps on a semiconductor chip and bond pads on a substrate is the increasing mismatch that the differential thermal expansion coefficient between the materials involved (e.g., silicon in a chip and polymer, glass-filled polymer, ceramic, metal, or composite metal/polymer/ceramic in any composition in a substrate) causes as process temperature increases. Room temperature in this case refers to the process and shipping temperature and aligning temperature of the chip and the substrate and in most cases is 22 to 25° C.

In accordance with an aspect of the invention, a calculation of room temperature bond pad locations on a substrate provides varying offsets relative to the locations of corresponding die pads, terminals, or solder bumps on a chip to be flip-chip mounted on the substrate. The offsets ensure that the bond pad locations on the substrate chip will match the chip pad, terminal, solder bump locations of the semiconductor chip at an elevated temperature such as the liquid/solid interface temperature or an operating temperature of the chip. Accordingly, the match of the spacings on the chip and the substrate is optimized at the elevated temperature, and the required precision of the flip-chip bonder that operates at a temperature at or above the elevated temperature is reduced.

One flip-chip package in accordance with an embodiment of the invention improves contact between a semiconductor chip and a substrate by having traces on the substrate spaced so that at the melting point of solder bumps, the spacing of contact points or pads in the traces matches the spacing of solder bumps on the chip. Accordingly, when a reflow or other high temperature process attaches the chip to the substrate, the solder bumps and pads are matched and aligned for a full contact for all solder bumps. The solder balls being aligned with the pads form a strong bond to the pads.

Figure 1:
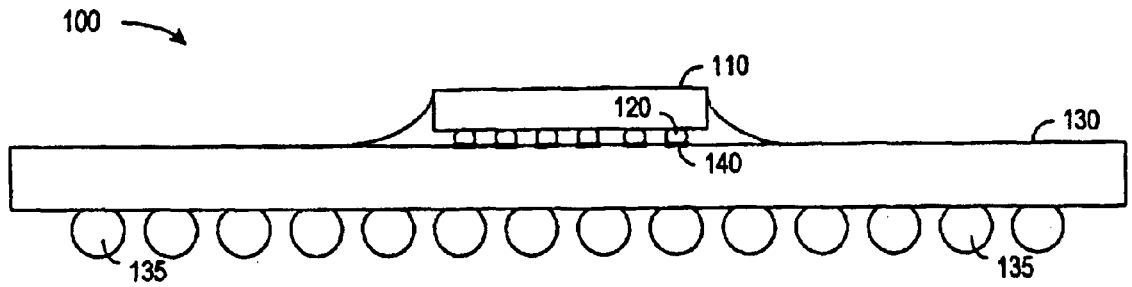
FIG. 1 is a cross-sectional view of a conventional flip-chip package.
Figure 2A:
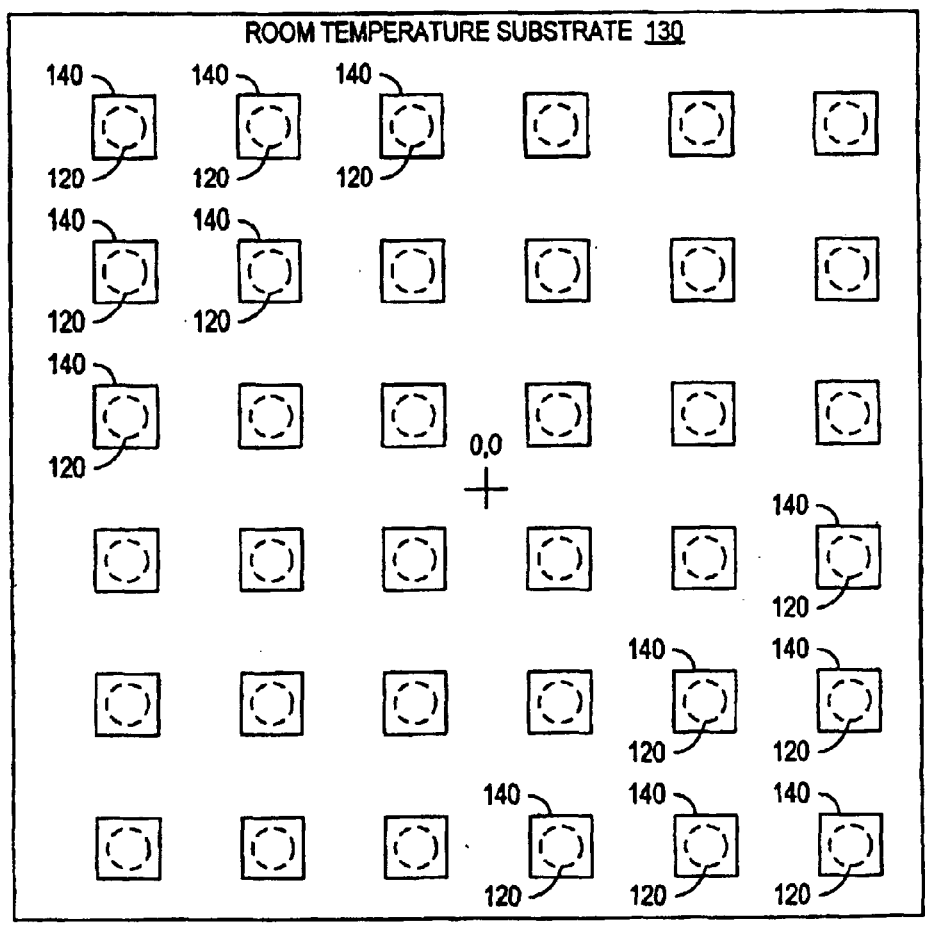
FIGS. 2A and 2B respectively illustrate best case alignments of solder bumps and traces on a substrate at room temperature and an elevated temperature in conventional flip-chip package.
Figure 2B:
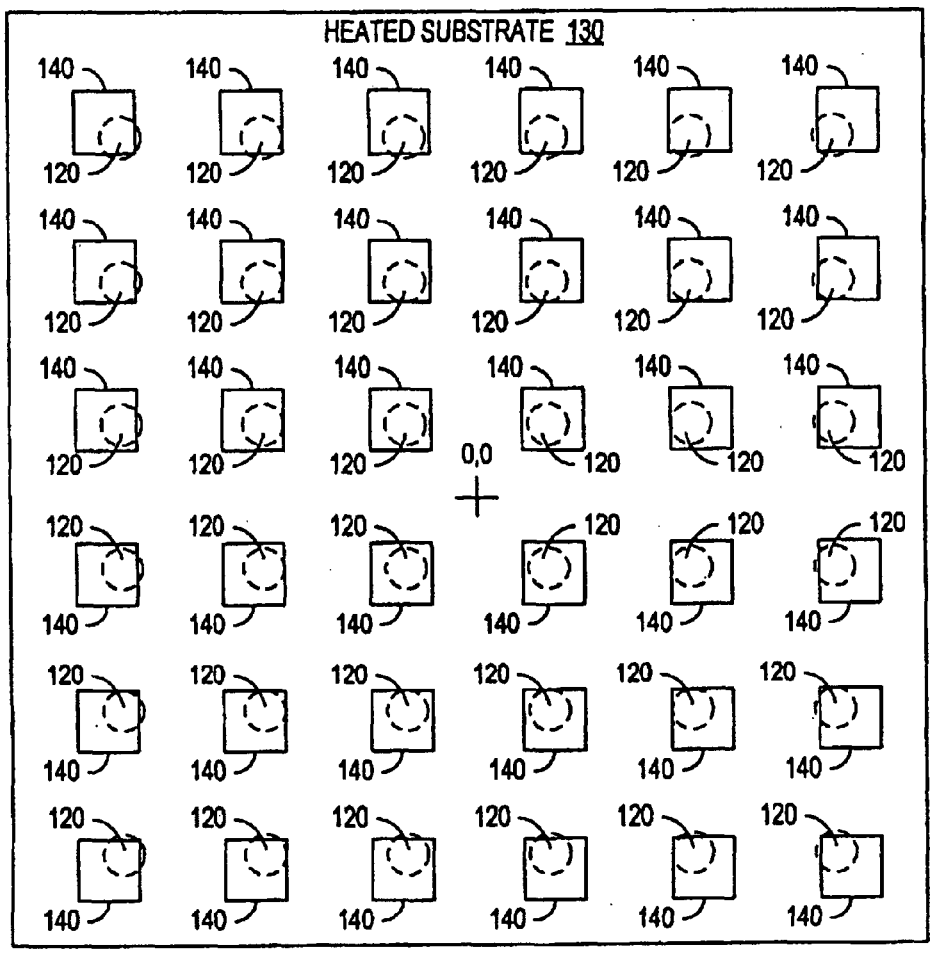
Figure 3:
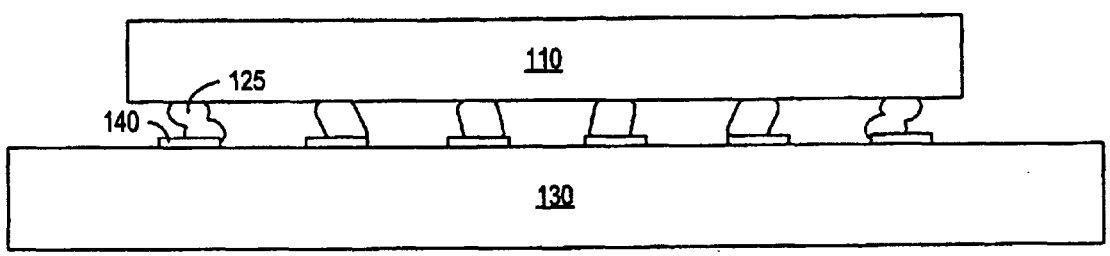
FIG. 3 is a room temperature cross-section of a portion of a conventional flip-chip including weak or undependable connections between a chip and a substrate.
Figure 4:
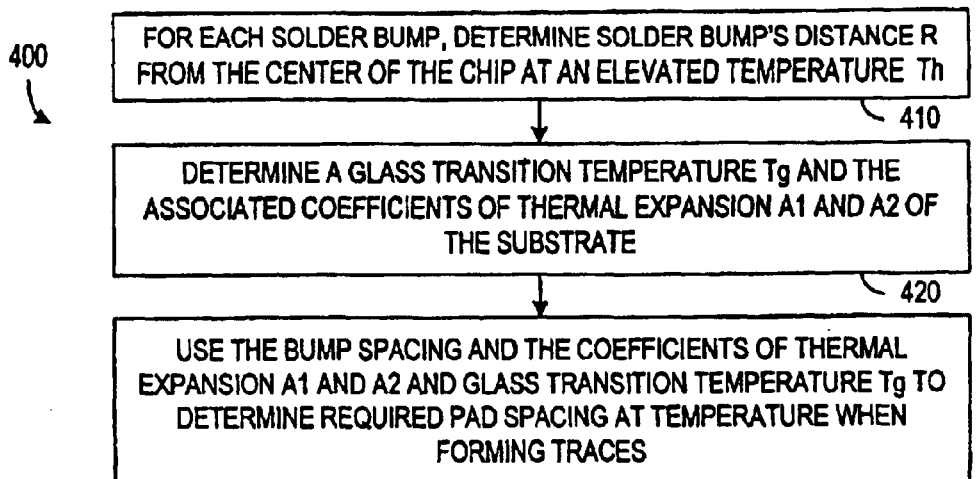
FIG. 4 is a flow diagram of a process for determining the pad spacing in accordance with an embodiment of the invention.
Figure 5A:
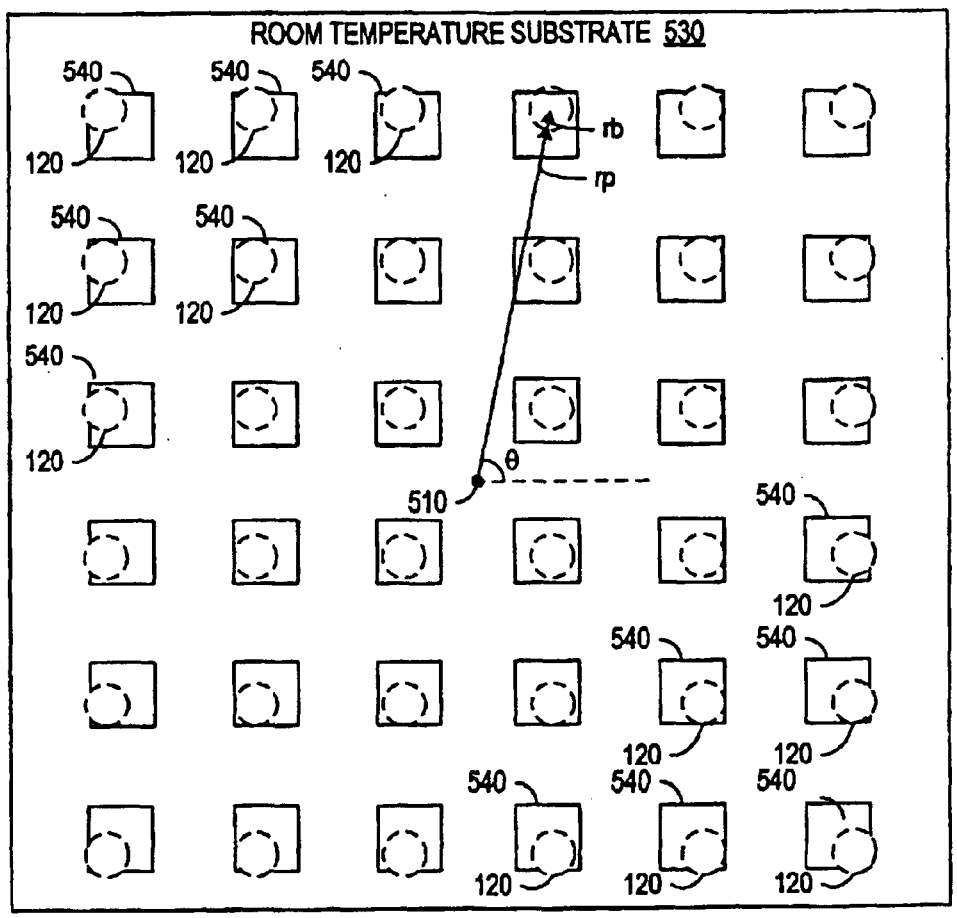
FIGS. 5A and 5B respectively illustrate alignment of solder bumps and bond pads on a substrate at room temperature and an elevated temperature in a flip-chip package in accordance with an embodiment of the invention.
Figure 5B:
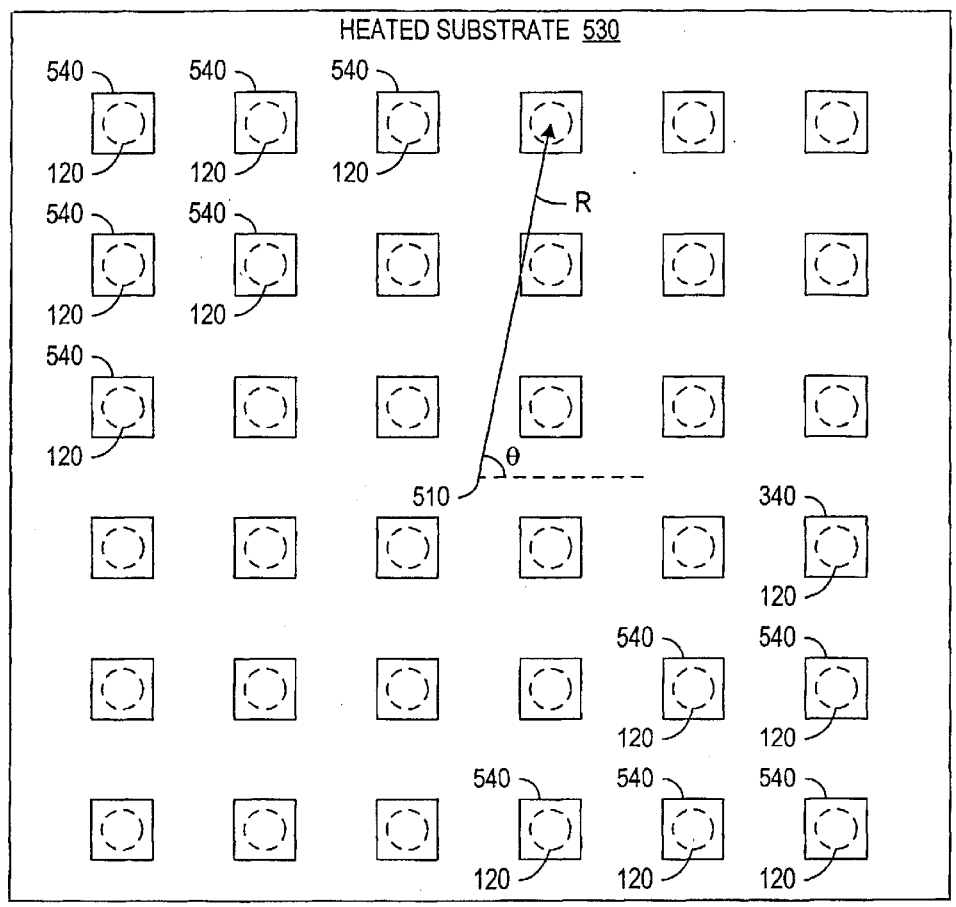

The trace pattern or bond pad spacing that incorporates the negative compensation (e.g., room temperature misalignment) and provides the desired alignment at an elevated temperature depends on the spacing of the solder bumps or die pads on the semiconductor chip and the thermal properties of the substrate and the semiconductor chip. FIG. 4 shows a flow diagram of a process 400 for determining the correct trace pattern or the spacing of bond pads 540 on a substrate 530 (FIGS. 5A and 5B). Preferably, analysis of the substrate's trace pattern uses polar coordinates relative to a center 510 of a die attachment area on substrate 530, and center 510 is aligned with the center of solder bumps 120 when chip 110 is aligned with substrate 530. All positions of bond pad 540 or interconnection solder bumps 120 are calculated from aligned center 510.

Process 400 uses semiconductor chip 110, which can be an integrated circuit, a discrete transistor, a diode, a thyristor, or any device fabricated primarily out of a semiconductor material such as silicon, SiGe, GaAsP, GaAs, or Cu/CuO, as the reference for determining the trace pattern on substrate 530. Step 410 of process 400 calculates the positions of solder bumps 120 on chip 110 at an elevated temperature T1. In one embodiment, the elevated temperature T1 is the temperature at which the alloy or solder in solder bumps 120 changes from liquid to solid or as close to the melting point as possible (e.g., about 183° C. for a solder such as 63/37 Sn—Pb solder).

Generally, the positions of solder bumps 120 are known at a base temperature T0 (typically room temperature). Using an origin at center 510, the center of a solder bump 120 has coordinates (rb, θ) at base temperature T0 as shown in FIG. 5A. At the elevated temperature, the center of the same solder bump 120 has coordinates (R, θ) as shown in FIG. 5B. For a chip having uniform composition, only the radial coordinate of the solder bump 120 changes relative to the center of the chip as the temperature rises from base temperature T0 to elevated temperature T1. Equation 1 provides a formula for determining the radial coordinate of the solder bump at the elevated temperature given the coefficient of thermal expansion Cte of the chip, the elevated temperature T1, the base temperature T0, and the known radial coordinate rb at temperature T0.

$$R = rb \cdot \{1 + Cte \cdot (T1 - T0)\} \qquad \text{Equation 1}$$

At elevated temperature T1, the coordinates of the centers of pads 540 on substrate 530 are the same as the coordinates (R, θ) of the centers of the respective solder bumps 120. With this configuration, all solder bumps 120 can all be aligned with the centers of respective pads 540 at temperature T1, and as mentioned above, the aligned attachments provide stronger bonds.

Fabrication of substrate 530, including traces with pads 540 in the proper positions, requires knowledge of the positions (rp, θ) of pads 540 at base temperature T0. (More generally, the position of pads 540 at a fabrication temperature T2 for traces could be determined, but such fabrication processes typically use masks calibrated at room temperature.) For determination of the positions of pads 540 at base temperature T0, step 420 determines the thermal properties of substrate 530.

Price concerns typically lead to selection of a BT or polyimide polymer as the primary material in substrate 530.

This choice provides substrate 530 with a glass transition temperature Tg that is typically between 180 and 260° C. The difference between the thermal coefficients of expansion of substrate 530 and chip 110 is greater at temperatures above the glass transition temperature Tg of substrate 530. Where glass transition Tg is between base temperature T0 and elevated temperature T1, step 420 determines the coefficients of thermal expansion Cte1 and Cte2 that apply below and above glass transition temperature Tg.

Once the thermal properties of substrate 530 are known, step 430 determines the room temperature positions of pads 540 based on the positions at elevated temperature T1. In particular, when glass transition Tg is between base temperature T0 and elevated temperature T1, Equation 2 provides the radial coordinate rp of the center of a pad 540 in terms of the determined radial coordinate R at the elevated temperature T1, coefficients of thermal expansion Cte1 and Cte2 and glass transition temperature Tg of substrate 540, and temperatures T1 and T0. The use or application of a higher Tg substrate material would simplify the calculation in a manner readily apparent to those skilled in the art.

$$rp = R \cdot \{1 \, Cte2 \cdot (T1-Tg)Cte1 \cdot (Tg-T0)\} = rb \cdot \{1 + Cte \cdot (T1-T0)\} \cdot \{1 Cte2 \cdot (T1-Tg)Cte1 \cdot (Tg-T0)\} \quad \text{Equation 2}$$

Equation 2 presumes that coefficients of thermal expansion Cte, Cte1, and Cte2 accurately reflect linear expansion of materials in respective temperature ranges. If the approximation of Equation 2 is inaccurate for a particular material or temperature range, measurements can be made of the actual thermal mechanical properties of the materials through the thermal range. Alternatively, other methods, which may be known for determining the thermal changes in materials, can be used to determine the positions rp of pads 540 that achieve the desired match with solder bumps 120 at the elevated temperature T1.

A flip-chip bonding process flips, positions, and aligns chip 110 on substrate 530 either at room temperature, the elevated temperature, or the soldering temperature (which may be the same as the elevated temperature). FIG. 5A shows the ideal or target alignment at room temperature, and FIG. 5B shows the ideal or target alignment at the elevated temperature. At any temperature, the ideal alignment aligns the center 510 of substrate 530 with the center of the solder ball array on chip 110. A conventional flip-chip bonder can perform the alignment using conventional techniques. Once chip 110 and substrate 530 are aligned the assembly is heated to the soldering temperature so that solder bumps 120 melt and adhere to both pads on chip 110 and corresponding bonding pads 540 on substrate 530. At the soldering temperature, capillarity of the liquid solder generally improves the bond between pads if more than 50% of the area of the pads overlap, but capillarity makes bonds worse if less than 50% of the area of the pads overlap. With the pad spacing adjusted to match at the elevated temperature, a flip-chip bonder can more easily achieve a 50% area overlap for all die pads. Solder bumps 120 solidify when the assembly cools below the melting point of the solder.

Figure 6A:
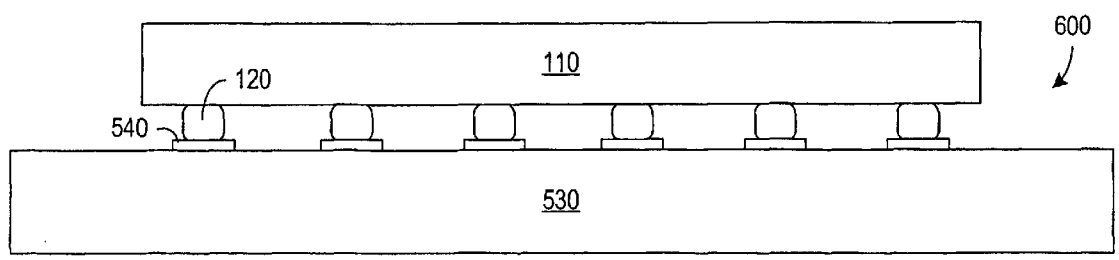
FIGS. 6A and 6B respectively show cross-sectional views of a flip-chip package in accordance with an embodiment of the invention at an elevated temperature and a base temperature, respectively.
Figure 6B:
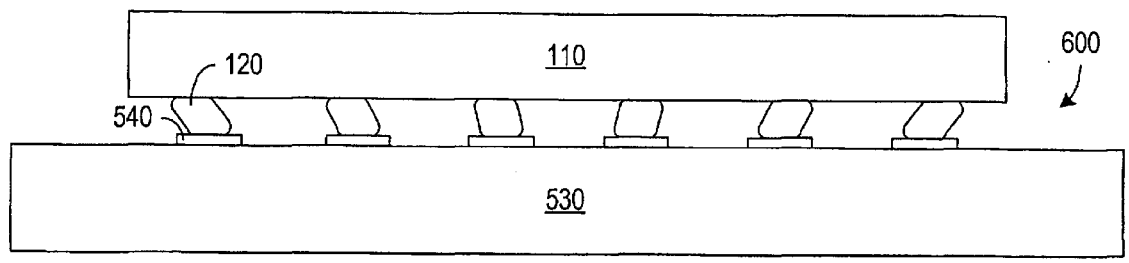

FIGS. 6A and 6B show cross-sectional views of a flip-chip package 600 in accordance with an embodiment of the invention at the elevated temperature T1 and a base temperature T0, respectively. In FIG. 6A, elevated temperature T1 is equal to the temperature at which solder bumps 120 bond with pads 540 (e.g., the elevated temperature is approximately equal to the bonding temperature at which solder bumps 120 change from the liquid phase to the solid phase). Accordingly, at the bonding temperature, solder bumps 120 on chip 110 are aligned with and match the spacing of bond pads 140 on substrate 130, and the bonding process forms strong, well-aligned bonds.

As the temperature decreases, both chip 110 and substrate 130 shrink, but the difference between coefficients of thermal expansion of chip 110 and substrate 130 typically causes substrate 130 to shrink considerably more. Two points, for example, one point on a die pad of chip 110 and one point on a bond pad 140 of substrate 130, move in a linear relationship while a temperature excursion is underway (assuming constant coefficients of thermal expansion, (e.g., a glass transition temperature Tg outside the range of the temperature excursion). As shown in FIG. 6B, when the package reaches the base temperature T0, the differential shrinkage causes stress and strain in solder bumps 120. The larger the temperature excursion below room temperature (i.e., to 55 C) the larger the stress level, while temperature increases up to the elevated temperature T1 relieve at least some of the stress. Such stress can lead to failure of a package and must be accounted for in design of a package having an acceptably long useful life.

Modification of the elevated temperature T1 in process 400 gives the package designer an ability to optimize performance of the package for a desired temperature cycle; e.g., TCA (0 to 100° C.), TCB (–55 to 125° C.), or TCK (0 to 125° C.). If a device requires a 0 to 125° C. temperature cycle, for example, elevated temperature T1 can be set to a lower temperature than the melting point (e.g., at a temperature 67.5° C.), which is the midpoint of the temperature cycle. Choosing an elevated temperature T1 lower than the melting point causes somewhat worse alignment during the bonding process but may improve the expected life of the package. At the elevated temperature T1, the connections between chip 110 and substrate 530 are aligned. When the temperature rises above elevated temperature T1, the connections deform in a direction corresponding to the faster expansion of substrate 530. When the temperature drops below elevated temperature T1, the connections deform in an opposite direction corresponding to the faster shrinkage of substrate 530. Accordingly, if the elevated temperature T1 is at the center of the temperature cycle, deformations of the electrical connections in one direction balance deformations in the opposite direction during temperature cycling. In actual operation of a chip in a package, the elevated temperature T1 that provides the longest useful life will depend on the operating temperatures of the device and may not be at the midpoint of the temperature cycle.

Adjusting the spacing of the traces on a substrate to compensate for temperature changes, even when the compensated temperature is below the bonding temperature, improves alignment and bonding of the chip and the substrate when compared to uncompensated structures that match at room temperature. As mentioned above, an advantage of the temperature-compensated trace pattern is a significant enhancement of placement precision for a flip-chip bonder. Alternatively, a flip-chip bonder having a given precision can now perform a bonding operation for a chip having more closely spaced terminals and smaller bond pads on a substrate.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A method for fabricating a flip-chip package, comprising:
   aligning a chip with a substrate including conductive traces, wherein terminals of the chip respectively correspond to contact areas of the traces, and a pattern of the terminals matches a pattern of the contact areas at an elevated temperature and does not match the pattern of the contact areas at room temperature;
   selecting the elevated temperature to be equal to an expected operating temperature of the flip-chip package; and
   bonding the terminals to the corresponding contact areas at a bonding temperature.

2. The method of claim 1, wherein the bonding temperature is higher than the elevated temperature.

3. The method of claim 2, wherein the terminals comprise solder bumps, and the bonding temperature is about equal to a melting temperature of the solder bumps.

4. The method of claim 1, wherein the elevated temperature is selected to minimize thermal stress on bonds between the terminals and the contact areas during thermal cycling of the flip-chip package.

5. The method of claim 1, wherein the elevated temperature is about equal to a middle temperature of a temperature range expected during thermal cycling of the flip-chip package.

6. The method of claim 5, wherein the temperature range is selected from the group consisting of 0 to 100° C., −55 to 125° C., and 0 to 125° C.

7. A method for fabricating a package for a chip containing an integrated circuit, comprising:
   selecting an operating temperature of the package;
   constructing a substrate having contact areas with a pattern that matches a pattern of terminals on the chip when the substrate and the chip are at the operating temperature selected, wherein at room temperature, the pattern of the contact areas does not match the pattern of the terminals on the chip; and
   bonding the terminals to the corresponding contact areas at a bonding temperature that is higher than the operating temperature selected.

8. The method of claim 7, wherein the operating temperature selected is a midpoint temperature of a temperature cycle for the package.

9. The method of claim 8, wherein the temperature cycle is selected from the group consisting of 0 to 100° C., −55 to 125° C., and 0 to 125° C.

* * * * *